United States Patent [19]

Yabusaki et al.

[11] Patent Number: 4,929,881
[45] Date of Patent: May 29, 1990

[54] PROBE FOR NUCLEAR MAGNETIC RESONANCE APPARATUS

[75] Inventors: Masao Yabusaki, Tokyo; Etsuji Yamamoto, Akishima; Hiroyuki Takeuchi, Kashiwa; Hideki Kohno, Tama, all of Japan

[73] Assignees: Hitachi, Ltd., Tokyo; Hitachi Medical Corporation, Tokyo, both of Japan

[21] Appl. No.: 356,423

[22] Filed: May 25, 1989

[30] Foreign Application Priority Data

May 27, 1988 [JP] Japan .................................. 63-128359

[51] Int. Cl.$^5$ ............................................. G01R 33/20
[52] U.S. Cl. ...................................... 324/318; 333/219
[58] Field of Search ................ 324/300, 307, 309, 315, 324/316, 318, 322; 333/219

[56] References Cited

U.S. PATENT DOCUMENTS 4,641,097 2/1987 Bottomley ........................... 324/318
4,825,163 4/1989 Yabusaki et al. .................... 324/322

OTHER PUBLICATIONS

Alderman et al., "An Efficient Decoupler Coil Design which Reduces Heating in Conductive Samples in Superconducting Spectrometers", J. Mag. Res., 36, pp. 447–451 (1979).

Primary Examiner—Michael J. Tokar
Attorney, Agent, or Firm—Antonelli, Terry, Stout & Kraus

[57] ABSTRACT

There is provided a probe to detect a nuclear magnetic resonance signal in which each of a plurality of arms forming a current path of an Alderman-Grant type coil is divided into two conductor plates, the two conductor plates are connected by an inductor, and a resonance frequency is reduced by increasing the inductance of the current path.

8 Claims, 2 Drawing Sheets

PROBE FOR NUCLEAR MAGNETIC RESONANCE APPARATUS

BACKGROUND OF THE INVENTION

The present invention relates to a probe which is used in an NMR imaging apparatus or the like and, more particularly, to a slotted tube resonator type probe which is used in an NMR apparatus of a relatively low magnetic field.

Since the S/N ratio in the NMR apparatus increases in proportion to about 1.5 power of a static magnetic field H, there has been made a trial to improve the S/N ratio by increasing the magnetic field strength as large as possible. As a probe to transmit and receive a radio frequency signal of the NMR apparatus, a solenoid coil or a saddle-shaped coil has been used so far. However, since the resonance frequency also becomes high with an increase in magnetic field strength, there occurs a situation such that the self resonance frequency of the coil and the NMR frequency approach or are reversed. Thus, there occurs a problem such that the sensitivity upon reception deteriorates or the generating efficiency of the radio frequency magnetic field upon transmission deteriorates.

On the other hand, a coil having a new shape called "Alderman-Grant type" has been proposed by Alderman et al. The Alderman-Grant type coil has been disclosed in "Journal of Magnetic Resonance", Vol. 36, pages 447 to 451.

The Alderman-Grant type coil is fairly effective with respect to a point such as to solve the problem such that the sensitivity upon reception deteriorates due to the approach or reversal of the self resonance frequency of the coil and the NMR frequency due to the increase in resonance frequency by the increase in magnetic field strength mentioned above or the generating efficiency of the radio frequency magnetic field upon transmission deteriorates. In addition, the Alderman-Grant type coil has a feature such that the sensitivity distribution is more uniform as compared with that of the saddle-shaped coil or the like.

However, in the above related art, an attention is mainly paid to the improvement of the self resonance frequency and no consideration is made to the problem in the case where the feature of the uniformity of the sensitivity distribution or the like which the Alderman-Grant type coil has is contrarily applied to the low frequency band.

That is, since the self resonance frequency of the Alderman-Grant type coil is high, in order to apply the Alderman-Grant type coil to a low resonance frequency, it is necessary to increase the capacitance which is formed between the wing and the guard ring or to increase the capacitance which is inserted between the wings. To increase the capacitance which is formed between the wing and the guard ring, it is necessary to reduce the distance between the wing and the guard ring or to increase the areas of the wing and the guard ring.

However, when the distance between the wing and the guard ring is reduced, the distance between the electrodes decreases, so that the withstanding voltage decreases. On the other hand, there occurs a problem such that the coil characteristic also remarkably varies due to a slight change in the distance between the electrodes by the external force. In addition, when the areas of the wings and guard rings are increased, the whole probe becomes long, resulting in an increase in weight.

On the other hand, there is a problem such that when the capacitance which is inserted between the wings is set to be too large, the operation of the probe is not executed as a whole.

Although there is also considered a method of substantially increasing the capacitance between the wing and the guard ring by inserting the capacitor between the wing and the guard ring, there is a problem such that the characteristic of the probe deteriorates.

SUMMARY OF THE INVENTION

It is an object of the present invention to provide a probe in which the sensitivity characteristic in a low frequency band is excellent, that is, which is suitable for use in an NMR apparatus of a relatively low magnetic field.

Another object of the invention is to further provide a probe which is suitable to construct a crossed coil system in which the transmission and reception are executed by different coils.

The present invention is characterized by a construction in which a conductor forming an arm of an Alderman-Grant type coil is divided into two upper and lower parts and an inductor is connected between those two parts. With such a construction, the inductance of a current path of the Alderman-Grant type coil can be easily raised. In the case where the capacitance is increased and the resonance frequency is lowered, the probe of the low loss and the stable operation can be obtained.

On the other hand, if a series circuit comprising a capacitor and a switching device which is closed upon transmission and is opened upon reception is connected in parallel with the inductor, the probe which has a low resonance frequency and whose receiving sensitivity is lowered upon transmission can be obtained.

DESCRIPTION OF THE PREFERRED EMBODIMENTS

An embodiment of the present invention will be described hereinbelow with reference to the drawings.

Figure 1:
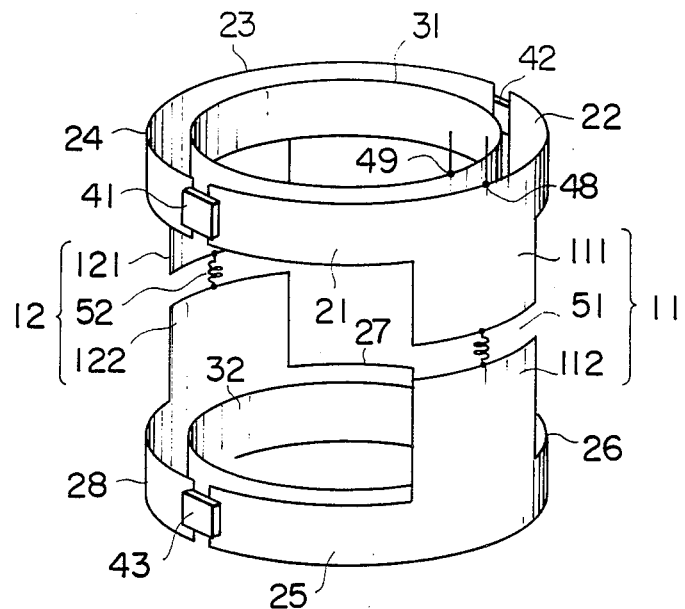
FIG. 1 is a perspective view of an embodiment of the present invention.
Figure 2:
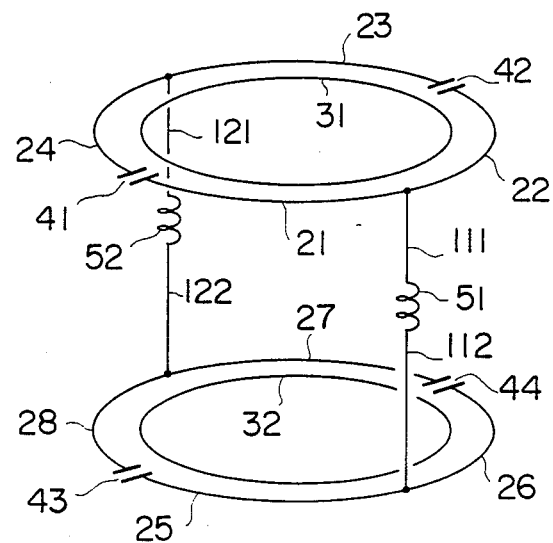
FIG. 2 is an equivalent circuit diagram of the above embodiment.

FIG. 1 is a perspective view of an embodiment of the invention. FIG. 2 is an equivalent circuit diagram of FIG. 1.

A probe in the embodiment has an almost cylindrical shape. Two arms 11 and 12 serving as a current path are formed in parallel with a center axis of the cylinder surface. Hitherto, each of the arms has been formed by a conductor plate having a uniform width. In the embodiment, each arm comprises two conductor plates divided in the direction of the cylinder axis and a coil connecting those two conductor plates. That is, the arm 11 comprises: an upper arm 111 made of a conductor plate which is formed along the cylinder surface; a lower arm 112 similarly made of a conductor plate; and a coil 51 connecting the upper and lower arms 111 and 112. The arm 12 existing at the position which is symmetrical to the position of the arm 11 also comprises: an upper arm 121 made of a conductor plate; a lower arm 122 likewise made of a conductor plate; and a coil 52 connecting the upper and lower arms 121 and 122. Wings 21 and 22 are extended to the left and right sides from the upper edge of the arm 111 along the cylinder surface. The arm 111 and wings 21 and 22 are formed by a piece of conductor plate. Similarly, wings 23 and 24 are extended from the upper edge of the upper arm 121, wings 25 and 26 are extended from the lower edge of the lower arm 112, and wings 27 and 28 also extended from the lower edge of the lower arm 122. The front edges of the wings 21 and the front edges of the wings 24 are closely arranged. Similarly, the front edges of the wings 22 and 23 are also close, the front edges of the wings 25 and 28 are also close, and the front edges of the wings 26 and 27 are also close. The wings whose front edges are close are capacitively coupled by capacitors 41, 42, 43, and 44 (not shown in FIG. 1), respectively. A guard ring 31 made of a ring-shaped conductor plate is provided on the inside of the wings 21, 22, 23, and 24. Another guard ring 32 is also provided on the inside of the wings 25, 26, 27, and 28. With such a structure, each wing is capacitively coupled with the guard rings 31 and 32, so that a probe having almost uniformly the sensitivity to the radio frequency magnetic field components in the lateral direction over the whole region of the inside of the probe is formed.

Two points comprising a point 48 existing at the front edge portion of one of the arms and a point 49 existing on the just inside of the point 48 in the radial direction of the cylinder shape are used as feed points of the probe and also signal output points.

The four pieces of the conductor plates forming the arms and wings are formed on the outside surface of a cylindrical bobbin which is ordinarily made of a dielectric material. The conductor plates forming the guard rings 31 and 32 are formed on the inside of the bobbin. Therefore, each guard ring and each wing are capacitively coupled through the bobbin. However, only the portions corresponding to the guard rings 31 and 32 can be also made of a ring-shaped dielectric material. The bobbin is not limited to the cylindrical shape but can be also formed into an elliptic or square cross sectional shape.

Figure 3:
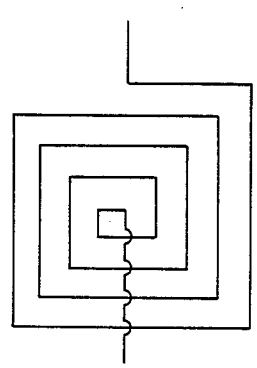
FIGS. 3 and 4 are plane view showing examples of inductors, respectively.
Figure 4:
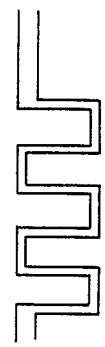

A solenoid coil wound in a small diameter can be used as each of the coils 51 and 52. A coil wound concentrically as shown in FIG. 3 or a coil made of a thin conductor wire formed like a zigzag shape on a flat plane as shown in FIG. 4 can be also used as each of the coils 51 and 52. In any cases, it is sufficient to use an inductor having a predetermined inductance. In the cases of the coils of FIGS. 3 and 4, the coils can be directly formed on the bobbin formed with the arms and wings of FIG. 1.

In the probe as mentioned above, when it is now assumed that a synthetic capacitance of the capacitance formed between the wing and the guard ring and the capacitance which is inserted between the wings is C and an inductance of the current path is L, a resonance frequency ω of the probe is expressed by $$\omega^2 = \frac{1}{LC}$$

In the above embodiment, the inductance L can be easily increased by dividing the arm into two parts and connecting the coils 51 and 52 between the two parts. Therefore, as compared with the case of increasing the synthetic capacitance C, the low resonance frequency can be easily obtained and the probe of a small loss is derived. In particular, such a probe is suitable for use in a nuclear magnetic resonance imaging apparatus of a relatively low magnetic field using a permanent magnet. On the other hand, the value of C can be also enlarged by further externally connecting a capacitance between the wing and the guard ring.

A probe suitable for use in an NMR apparatus of the crossed coil system will now be described. In the crossed coil system, a transmitting coil to generate a radio frequency magnetic field and a probe to detect an NMR signal are separately provided, thereby separating the transmission and reception of the radio frequency magnetic field. Further, it is necessary to make the signal detecting probe inoperative for the period of time when the radio frequency magnetic field is generated.

Figure 5A:
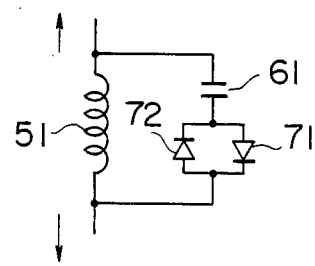
FIGS. 5A and 5B are circuit diagrams of additional circuits in other embodiments.
Figure 5B:
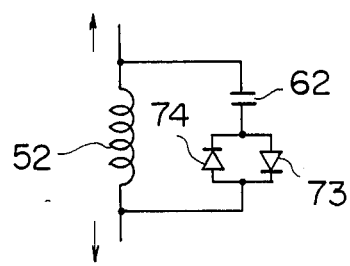

In such a case, as shown in FIG. 5A, a series circuit of a capacitor 61 and diodes 71 and 72 which are connected in reverse parallel is connected in parallel with the coil 51 in FIG. 1. Similarly, a series circuit of a capacitor 62 shown in FIG. 5B and diodes 73 and 74 which are connected in reverse parallel is also connected to the coil 52.

The values of the capacitances and inductances of the coils 51 and 52 and capacitors 61 and 62 are selected so that they resonate at the resonance frequency of the NMR apparatus, respectively. When the radio frequency magnetic field is generated by the transmitting coil, a pair of diodes are set to the on state by the voltage which is detected by the probe. A resonance circuit is formed by the coils and capacitors. An apparent impedance of the parallel circuit increases. Such a state is equivalent to a state in which the arms were decoupled. On the contrary, since the pair of diodes are disconnected upon reception, the coils 51 and 52 and capacitors 61 and 62 do not form a resonance circuit and a signal can be received. Although the pair of diodes have been used in the embodiment, it is also possible to use a switch which operates synchronously with the transmission and reception.

On the other hand, although the arm has been divided at an almost central position of the arm in the embodiment, the dividing position is not limited to such a position. On the other hand, it is also possible to divide each arm into three parts and to connect each dividing point by inductors, respectively.

We claim:

1. A probe for a nuclear magnetic resonance apparatus comprising:
   are arranged at a plurality of
   arms which positions along an almost cylindrical surface and form a current path;
   a plurality of wings made of conductor plates which are respectively extended to the right and left from upper and lower edges of said arms along said cylindrical surface and in which front edges of each of said plurality of wings are capacitively coupled with front edges of the wing adjacent to said wing; and
   first and second guard rings made of ring-shaped conductor plates which are respectively provided at upper and lower edge positions of said arms and are respectively capacitively coupled with said wings, wherein each of the arms comprises two conductor plates divided into upper and lower portions and an inductor connecting said two conductor plates.

2. A probe according to claim 1, wherein said inductor comprises a solenoid coil.

3. A probe according to claim 1, wherein said inductor is formed onto the same board as the conductor plate forming the arm.

4. A probe according to claim 1, wherein said inductor comprises a spiral coil.

5. A probe according to claim 1, wherein said inductor comprises a zigzag-shaped thin conductor wire.

6. A probe according to claim 1, wherein a series circuit of a capacitor and a switching device is further connected in parallel with said inductor.

7. A probe according to claim 6, wherein said inductor and said capacitor have an inductance and a capacitance adapted to resonate at a resonance frequency of the nuclear magnetic resonance apparatus.

8. A probe according to claim 6, wherein said switching device is constructed by diodes which are connected in reverse parallel.

* * * * *